(12) United States Patent
Jo et al.

(10) Patent No.: US 6,473,353 B2
(45) Date of Patent: Oct. 29, 2002

(54) REFRESH METHOD CAPABLE OF REDUCING MEMORY CELL ACCESS TIME IN SEMICONDUCTOR MEMORY DEVICE

(75) Inventors: Seong-kue Jo, Suwon (KR); Jong-yul Park, Youngin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/991,725

(22) Filed: Nov. 14, 2001

(65) Prior Publication Data

US 2002/0141269 A1 Oct. 3, 2002

(30) Foreign Application Priority Data

Mar. 27, 2001 (KR) ........................................ 2001-16016

(51) Int. Cl.$^7$ ................................................. G11C 7/00
(52) U.S. Cl. ................................... 365/222; 365/230.03
(58) Field of Search ........................... 365/222, 230.03, 365/189.05, 189.07

(56) References Cited

U.S. PATENT DOCUMENTS 6,288,963 B1 * 9/2001 Kato ........................... 365/222

\* cited by examiner

*Primary Examiner*—Vu A. Le
(74) *Attorney, Agent, or Firm*—F. Chau & Associates, LLP

(57) ABSTRACT

A refresh method for a semiconductor memory device capable of reducing memory cell access time and performing refresh operation is provided. In the refresh method for a semiconductor memory device, when refresh operation is requested, the low address for the refresh operation is latched, and it is determined whether a normal operation command is inputted into the semiconductor memory device. If the normal operation command is inputted into the device, block selection bits of a low address for normal operation is compared with block selection bits of the latched low address for the refresh operation. When block selection bits of both low addresses are the same, a word line for the refresh operation is activated by decoding the latched low address for the refresh operation. A word line for the normal operation is activated by simultaneously decoding the low address for the normal operation while the latched low address for refresh operation is decoded. That is, the normal operation and the refresh operation are simultaneously performed.

13 Claims, 3 Drawing Sheets

REFRESH METHOD CAPABLE OF REDUCING MEMORY CELL ACCESS TIME IN SEMICONDUCTOR MEMORY DEVICE

BACKGROUND OF THE INVENTION

1. Field of the Invention

The present invention relates to a semiconductor memory device, and more particularly, to a refresh method for a semiconductor memory device.

2. Discussion of Related Art

Dynamic random access memories (DRAMs) are widely used because of their high density and relatively high speed capability. Many memory cells can be packed into a DRAM because each cell is comprised of one transistor and one capacitor of simple configurations. Each cell is smaller than those of other memory devices such as static random access memories (SRAMs).

However, in DRAM memory cells, the data stored in each cell in the form of a charge in a capacitor is lowered by leakage after a predetermined time. Thus, the DRAM memory cells need to be periodically accessed, and the data stored in the capacitor refreshed.

Meanwhile, SRAMs do not require refreshing because each cell is made of a circuit such as a flip-flop which holds the data. The flip-flops in SRAMs facilitate higher speed operation because no refresh is needed but the flip-flops occupy more space per cell and thus memory capacity is lower than DRAMs.

There are two refresh methods for DRAMs, an automatic refresh method and a self-refresh method. In the automatic refresh method, a predetermined timing interval is assigned during normal operation of the DRAM, and refresh operation is automatically performed at the assigned interval. On the other hand, a self-refresh operation is performed when the DRAM is in stand-by mode. Automatic refresh operations and self-refresh operations are well known to one skilled in the art, and thus detailed descriptions thereof will be omitted.

A pseudo static random access memory (PSRAM) has characteristics of both DRAMs and SRAMs. The PSRAM has SRAM interfaces and a memory array structure comprised of DRAM memory cells. In the PSRAM, access time for normal operation and access time for refresh operation are independently assigned within memory cell access time tRC. Thus, even though the actual access time for the normal operation is about 30–35 nano seconds, the memory cell access time tRC is set to about at least 70 nano seconds to account for the access time for the refresh operation.

If the access time for the normal operation overlaps with the access time for the refresh operation in the PSRAM, malfunctions may occur. To prevent this overlap, the access time for the normal operation and the access time for the refresh operation are independently assigned within the memory cell access time tRC.

FIG. 1 illustrates a structure of a DRAM cell array block which employs a conventional refresh method. Here, assume that, during refresh operation, a word line WL1 of a memory cell array block 100 is activated and that memory cells M11~M18 connected to bit lines BL1~BL8 and to sense amplifiers S1~S8 are accessed. During the refresh operation, if a word line WL4 of the memory cell array block 100 is activated and other memory cells M21~M28 sharing bit lines BL1~BL8 and sense amplifiers S1~h S8 are accessed for normal operation, data different from refresh data is loaded onto the bit lines BL1~BL8 and the sense amplifiers S1~S8, and malfunctions may occur.

As described above, in the conventional refresh method, the access time for the normal operation and the access time for the refresh operation are independently assigned within the memory cell access time tRC to prevent the overlap of the access time for the normal operation and the access time for the refresh operation in the same memory cell array block. As a result, a longer amount of memory cell access time tRC is needed in the conventional refresh method.

SUMMARY OF THE INVENTION

Therefore, an object of the present invention is to provide a refresh method for a semiconductor memory device capable of reducing memory cell access time and performing refresh operation normally.

Another object of the invention is to provide a refresh method for a semiconductor memory device capable of performing normal operation and refresh operation at the same time.

A refresh method according to the present invention comprises the steps of latching a low address for refresh operation when the refresh operation is requested, determining whether a normal operation command is inputted into the semiconductor memory device, comparing block selection bits of a low address for normal operation with block selection bits of the latched low address for the refresh operation when the normal operation command is inputted into the semiconductor memory device, and activating a word line for the refresh operation by decoding the latched low address for the refresh operation when the block selection bits of the low address for the normal operation are different from the block selection bits of the latched low address for the refresh operation. In a preferred embodiment, the method further comprises the steps of maintaining the latched low address for the refresh operation when the normal operation command is not inputted into the semiconductor memory device, and maintaining the latched low address for the refresh operation when the block selection bits of the low address for normal operation are the same as the block selection bits of the latched low address for the refresh operation.

In the present invention, a word line for the normal operation is activated by simultaneously decoding the low address for the normal operation while the latched low address for the refresh operation is decoded. That is, the normal operation and the refresh operation are simultaneously performed.

In one preferred embodiment, a refresh method for a semiconductor memory device comprises the steps of latching a low address for refresh operation when the refresh operation is requested; determining a mode of the semiconductor memory device; activating a word line for the refresh operation by decoding the latched low address for the refresh operation when the mode of the semiconductor memory device is a stand-by mode. In the preferred embodiment, the method further comprises the step of determining whether a normal operation command is inputted into the semiconductor memory device when the mode of the semiconductor memory device is a busy mode.

The above objective and advantages of the present invention will become more apparent by describing in detail a preferred embodiment thereof with reference to the attached drawings.

BRIEF DESCRIPTION OF THE DRAWINGS

The above objective and advantages of the present invention will become more apparent by describing in detail a preferred embodiment thereof with reference to the attached drawings in which.

DESCRIPTION OF PREFERRED EMBODIMENTS

Figure 1:
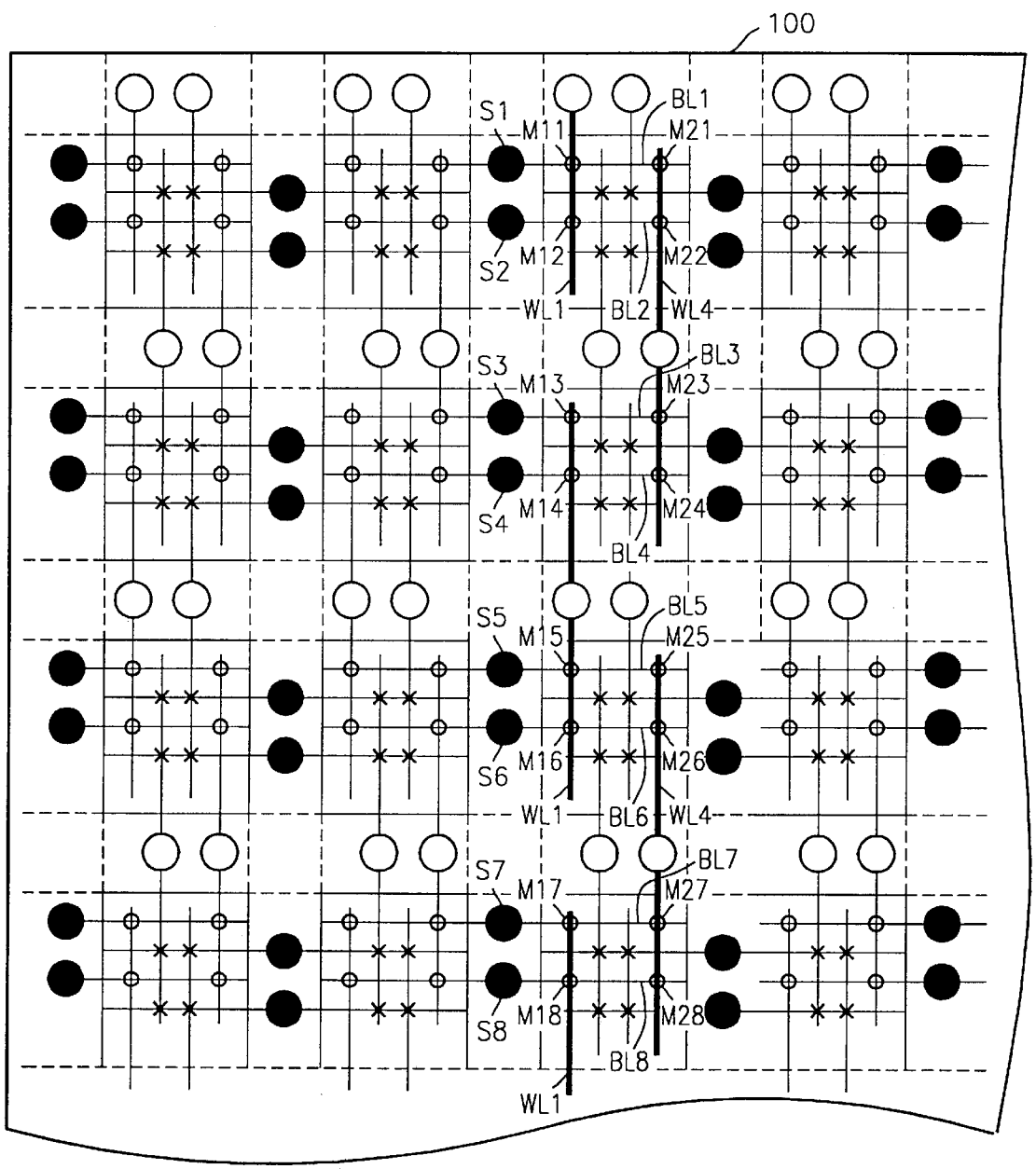
FIG. 1 illustrates a structure of a DRAM cell array block which employs a conventional refresh method.

Attached drawings illustrating preferred embodiments of the present invention and a description thereof should be referred to fully understand the advantages and objective of the present invention.

The present invention will be described more fully hereinafter with reference to the accompanying drawings in which a preferred embodiment of the invention is shown. Like reference numerals refer to like elements throughout the drawings.

Figure 2:
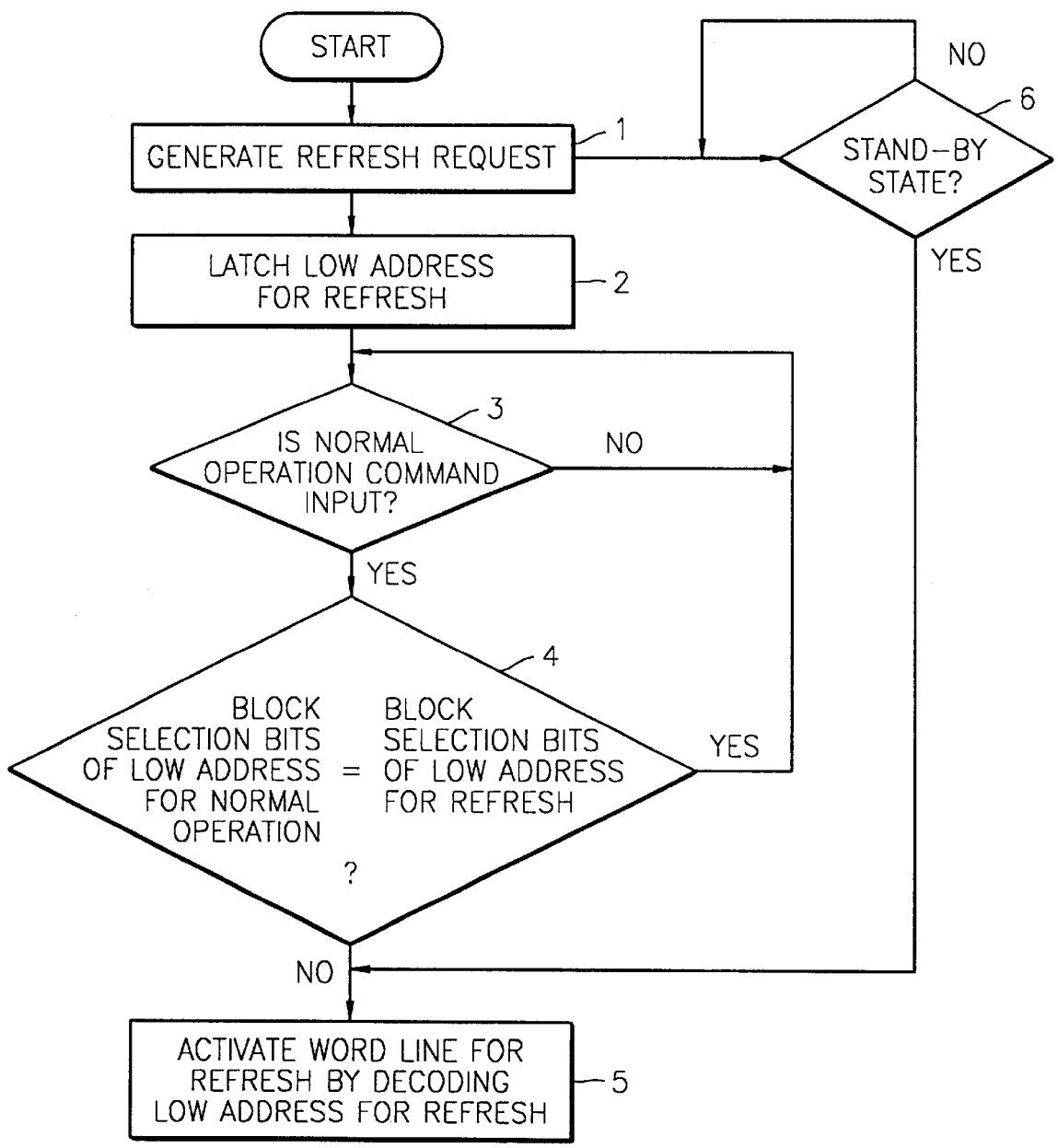
FIG. 2 is a flowchart illustrating a refresh method for a semiconductor memory device according to the present invention.

FIG. 2 is a flowchart illustrating a refresh method for a semiconductor memory device according to the present invention. Referring to FIG. 2, a refresh method for a semiconductor memory device according to the present invention includes steps 1 through 6. First, a low address for data to be refreshed is latched when refresh operation is requested inside the semiconductor memory device in steps 1 and 2. Next, it is determined whether a normal operation command, such as, a write command or a read command is inputted into the semiconductor memory device in step 3. When the normal operation command is not inputted into the semiconductor memory device, the latched low address for the refresh operation is maintained.

When the normal operation command is inputted into the semiconductor memory device, it is determined whether block selection bits of a low address for the normal operation are different from those of the latched low address for the refresh operation in step 4. In general, upper bits of the low address correspond to the block selection bits, and a corresponding memory cell array block is selected by the block selection bits.

As a result of the comparison in step 4, if the block selection bits of the low address for the normal operation are the same as the block selection bits of the latched low address for the refresh operation; in other words, if the accessed memory cell array block for the normal operation is the same as the accessed memory cell array block for the refresh operation, the latched low address is maintained and held until a next normal operation command and a next low address for normal operation are inputted into the semiconductor memory device. Then, the low address for the normal operation is decoded, and a word line for the normal operation is activated. That is, the refresh operation is not performed, but the normal operation is performed.

As a result of the comparison in step 4, if the block selection bits of the low address for the normal operation are different from those of the latched low address for the refresh operation; in other words, if the accessed memory cell array block for the normal operation is different from the accessed memory cell array block for the refresh operation, the latched low address for the refresh operation is decoded, and a word line for the refresh operation is activated in step 5. At that time, the low address for the normal operation is simultaneously decoded, and the word line for the normal operation is activated. That is, the normal operation is performed regardless of the comparison result in step 4, and the refresh operation and the normal operation are performed in two different memory cell array blocks at the same time.

In step 6, it is determined whether the refresh operation is requested in a stand-by mode. If the refresh operation is not requested in a stand-by mode, the request is held until a next refresh operation is requested. If the refresh operation is requested in the stand-by mode, the latched low address for the refresh operation is immediately decoded without performing steps 3~4, and the word line for the refresh operation is activated in step 5. In other words, if the refresh operation is requested in the stand-by mode, the refresh operation is immediately performed without comparison of the block selection bits.

Figure 3:
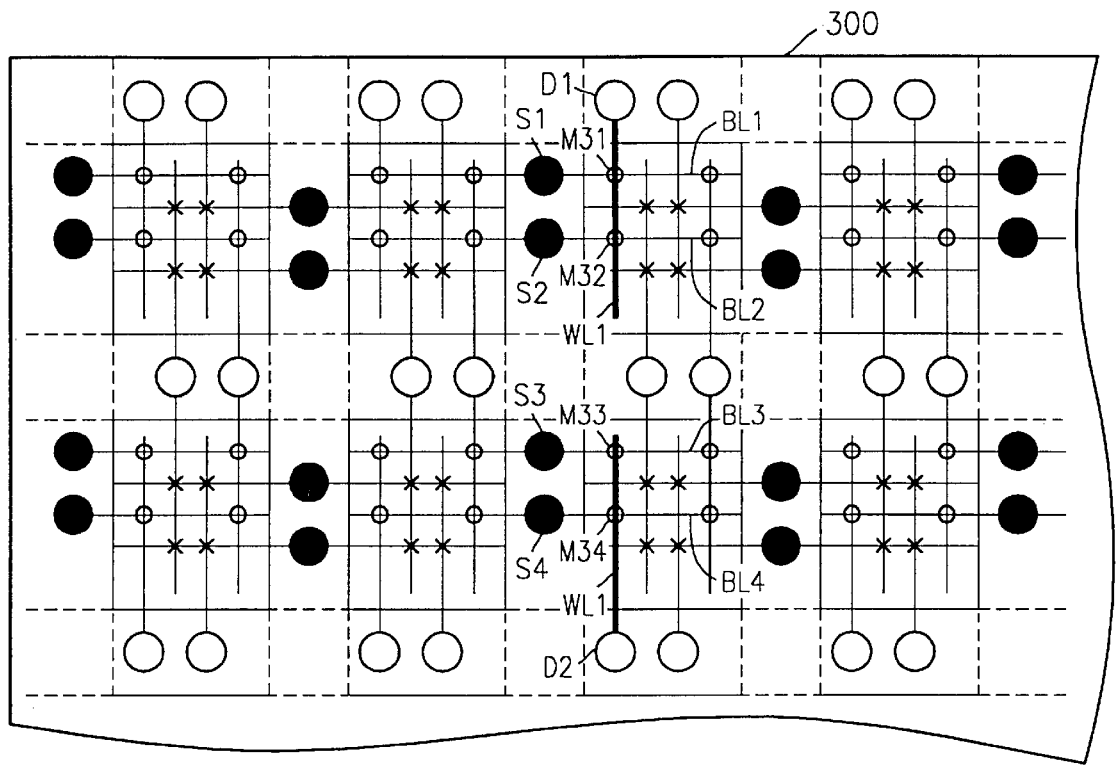
FIG. 3 illustrates a structure of a DRAM cell array according to a refresh method of the present invention.
Figure 3:
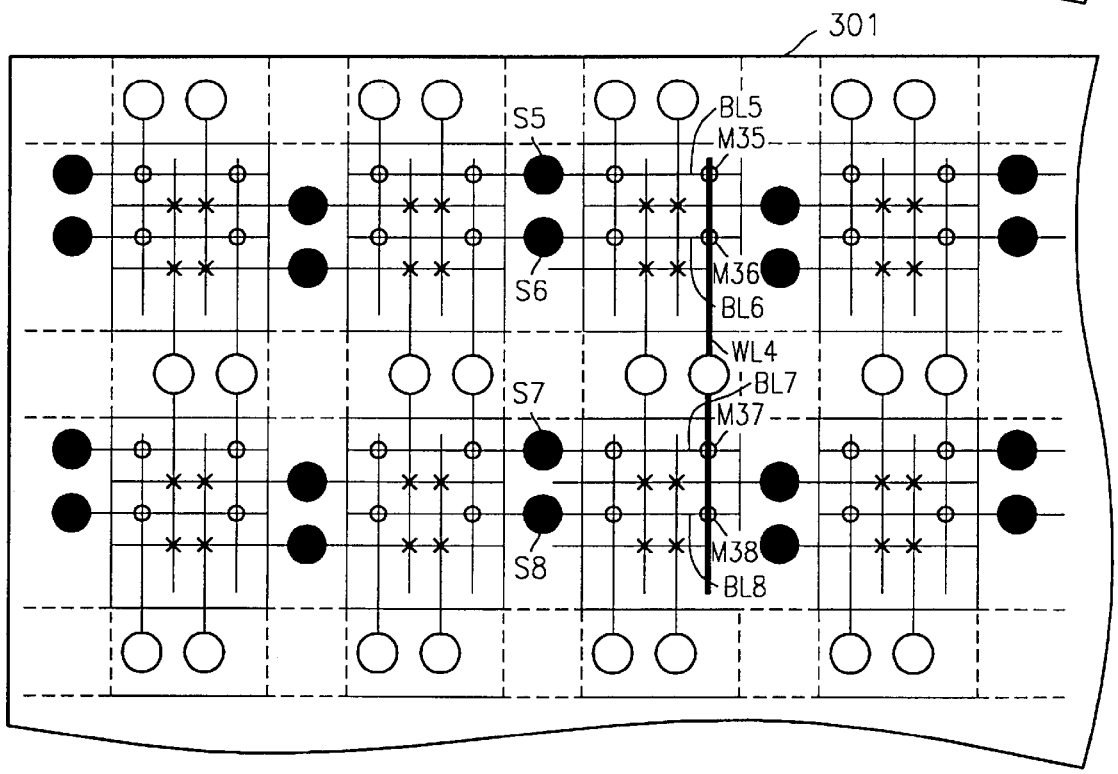

FIG. 3 illustrates a structure of a DRAM cell array according to the refresh method of the present invention. Here, reference numerals M31~M38, BL1~BL8, WL1 and WL4, S1~S8, and D1~D2 denote memory cells, bit lines, word lines, sense amplifiers, and word line drivers, respectively.

In a refresh method according to the present invention, a memory cell array block 300 is not accessed for refresh operation when the memory cell array block 300 is already accessed for normal operation such as a write operation or a read operation. Similarly, a memory cell array block 301 is not accessed for refresh operation when the memory cell array block 301 is already accessed for normal operation.

In other words, when the accessed memory cell array block for the normal operation is the same as the accessed memory cell array block for the refresh operation, only the normal operation is performed in the memory cell array blocks 300, 301.

As described above, it is determined whether the accessed memory cell array block for the normal operation is the same as the accessed memory cell array block for the refresh operation by comparing the block selection bits of the low address for the normal operation with the block selection bits of the low address for the refresh operation.

In a preferred embodiment according to the present invention, normal operation and refresh operation are simultaneously performed only when the accessed memory cell array block for normal operation is different from the accessed memory cell array block for refresh operation. For example, when the memory cell array block 301 is accessed for normal operation and the memory cell array block 300 is accessed for refresh operation, the normal operation for the memory cell array block 301 and the refresh operation for the memory cell array block 300 are simultaneously performed.

More specifically, when the refresh operation is requested, the low address for the refresh operation, for example, the low address for selecting the word line WL1 of the memory cell array block 300, is latched. Next, when the normal operation command is inputted into the semiconductor memory device, the low address for normal operation is compared to the low address for the refresh operation. That is, it is determined whether the block selection bits of the low address for selecting the word line WL4 of the memory cell array block 301 are the same as or different from the block selection bits of the latched low address for selecting the word line WL1 of the memory cell array block 300. In this case, the block selection bits of the low address for selecting the word line WL4 of the memory cell array block 301 are different from the block selection bits of the latched low address for selecting the word line WL1 of the memory cell array block 300. Then the word line WL4 of the memory cell array block 301 is activated for the normal operation, and simultaneously, the word line WL1 of the memory cell array block 300 is activated for the refresh operation.

Thus, the normal operation of the memory cells M35~M38 connected to the word line WL4 of the memory cell array block 301 and the refresh operation for the memory cells M31~M34 connected to the word line WL1 of the memory cell array block 300 are performed at the same time.

When the normal operation command is inputted into the semiconductor memory device, if the block selection bits of the low address for selecting the word line WL4 are the same as the block selection bits of the latched low address for selecting the word line WL1, the word line WL1 is not activated, and the refresh operation for the memory cells M31~M34 connected to the word line WL1 is not performed.

The refresh method according to a preferred embodiment of the present invention can be applied to a DRAM, a PSRAM, and a uni transistor RAM (UtRAM), and two conditions must be satisfied to accomplish the refresh method as below.

First, during normal operation, at least two different memory cell array blocks must be accessed within a predetermined period respectively. The latched low address generated in a refresh request must be processed before it is updated into a new low address for refresh operation by a next refresh request.

Second, it is necessary that a stand-by mode signal be inputted into a semiconductor memory device to maintain a stand-by mode longer than a refresh duty cycle. To do this, the semiconductor memory device may include an extra pin for receiving the signal. When the stand-by mode signal is inputted into the semiconductor memory device via the extra pin, the mode of the semiconductor memory device is changed into a stand-by mode. At that time, if refresh operation is requested, the semiconductor memory device immediately performs the refresh operation.

As described above, the present invention can prevent overlapping of the access for normal operation and access for refresh operation in the same memory cell array block. Also, the access for normal operation and the access for refresh operation can be simultaneously performed in different memory cell array blocks. Thus, the refresh method according to the present invention can reduce memory cell access time tRC and perform refresh operation normally.

While this invention has been particularly shown and described with reference to a preferred embodiment thereof, it will be understood by those skilled in the art that various changes in form and details may be made thereto without departing from the spirit and scope of the invention as defined by the appended claims.

What is claimed is:

1. A refresh method for a semiconductor memory device comprising the steps of:
   latching a low address for refresh operation when the refresh operation is requested;
   determining whether a normal operation command is inputted into the semiconductor memory device;
   comparing block selection bits of a low address for normal operation with block selection bits of the latched low address for the refresh operation when the normal operation command is inputted into the semiconductor memory device; and
   activating a word line for the refresh operation by decoding the latched low address for the refresh operation when the block selection bits of the low address for the normal operation are different from the block selection bits of the latched low address for the refresh operation.

2. The method of claim 1 further comprising the step of activating the word line for the refresh operation by immediately decoding the latched low address for the refresh operation when the refresh operation is requested in a stand-by mode.

3. The method of claim 1 further comprising the step of maintaining the latched low address for the refresh operation when the normal operation command is not inputted into the semiconductor memory device.

4. The method of claim 1 further comprising the step of maintaining the latched low address for the refresh operation when the block selection bits of the low address for the normal operation are the same as the block selection bits of the latched low address for the refresh operation.

5. The method of claim 1, wherein the normal operation and the refresh operation are simultaneously performed in the semiconductor memory device.

6. The method of claim 1, wherein a word line for the normal operation is activated by simultaneously decoding the low address for the normal operation while the latched low address for the refresh operation is decoded.

7. The method of claim 1, wherein the refresh operation is requested inside the semiconductor memory device.

8. A refresh method for a semiconductor memory device comprising the steps of:
   latching a low address for refresh operation when the refresh operation is requested;
   determining a mode of the semiconductor memory device;
   activating a word line for the refresh operation by decoding the latched low address for the refresh operation when the mode of the semiconductor memory device is a stand-by mode; and
   simultaneously performing the refresh operation of the latched low address and a normal operation in different memory cell blocks when the mode of the semiconductor memory device is a busy mode and a normal operation mode is inputted.

9. The method of claim 8, wherein the step of simultaneously performing the refresh operation of the latched address and a normal operation comprises the steps of:
   comparing block selection bits of a low address for the normal operation with block selection bits of the latched low address for the refresh operation; and
   activating a word line for the refresh operation by decoding the latched low address for the refresh operation when the block selection bits of the low address for the normal operation are different from the block selection bits of the latched low address for the refresh operation.

10. The method of claim 8 further comprising the step of inputting a stand-by mode signal in the semiconductor memory device to change the mode of the semiconductor memory device into the stand-by mode.

11. The method of claim 10, wherein the stand-by mode signal is inputted into the semiconductor memory device through an extra pin of the semiconductor memory device.

12. A refresh method for a semiconductor memory device comprising the steps of:
   latching a low address for refresh operation when the refresh operation is requested;
   determining a mode of the semiconductor memory device;

comparing block selection bits of a low address for normal operation with block selection bits of the latched low address for the refresh operation when a normal operation command is inputted in a busy mode of the semiconductor memory device;

performing the refresh operation of the latched low address while performing the normal operation when the block selection bits of the low address for the normal operation are different from the block selection bits of the latched low address for the refresh operation.

13. The method of claim 12 further comprising the step of immediately performing the refresh operation when the refresh operation is requested in a stand-by mode.

* * * * *